United States Patent
Kumar et al.

(10) Patent No.: US 10,032,763 B2
(45) Date of Patent: Jul. 24, 2018

(54) BULK CROSS-COUPLED HIGH DENSITY POWER SUPPLY DECOUPLING CAPACITOR

(71) Applicant: QUALCOMM Incorporated, San Diego, CA (US)

(72) Inventors: Albert Kumar, San Jose, CA (US); Hai Dang, San Diego, CA (US); Sreeker Dundigal, San Diego, CA (US); Vasisht Vadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 128 days.

(21) Appl. No.: 15/171,987

(22) Filed: Jun. 2, 2016

(65) Prior Publication Data

US 2017/0352651 A1   Dec. 7, 2017

(51) Int. Cl.
| | |
|---|---|
| *H03K 3/01* | (2006.01) |
| *H01L 27/02* | (2006.01) |
| *H01L 27/06* | (2006.01) |
| *H01L 29/94* | (2006.01) |
| *H01L 29/786* | (2006.01) |
| *H01L 29/10* | (2006.01) |

(52) U.S. Cl.
CPC ...... *H01L 27/0251* (2013.01); *H01L 27/0629* (2013.01); *H01L 29/1095* (2013.01); *H01L 29/7869* (2013.01); *H01L 29/94* (2013.01)

(58) Field of Classification Search
CPC ....... H03K 2217/0018; H03K 19/0016; H03K 19/00384; G05F 3/205; G11C 5/146
USPC ........................................................ 327/534
See application file for complete search history.

(56) References Cited

U.S. PATENT DOCUMENTS

| | | | | |
|---|---|---|---|---|
| 6,608,365 B1 * | 8/2003 | Li | ....................... | H01L 27/0811 |
| | | | | 257/204 |
| 7,508,696 B2 * | 3/2009 | Komaki | .............. | H01L 27/0682 |
| | | | | 365/149 |

(Continued)

FOREIGN PATENT DOCUMENTS

| | | | | |
|---|---|---|---|---|
| CN | 103247697 A | 8/2013 | | |
| GB | 2348556 A | * 10/2000 | ......... | H01L 27/0629 |

OTHER PUBLICATIONS

International Search Report and Written Opinion—PCT/US2017/024798—ISA/EPO—Jun. 8, 2017.

*Primary Examiner* — Quan Tra
(74) *Attorney, Agent, or Firm* — Arent Fox LLP

(57) ABSTRACT

In an aspect of the disclosure, a MOS device for using bulk cross-coupled thin-oxide decoupling capacitor is provided. The MOS device may include a pMOS transistor and an nMOS transistor. The MOS device may include a first set of transistor body connections adjacent the pMOS transistor and the nMOS transistor. The first set of transistor body connections may couple a first voltage source to the pMOS transistor body. The first set of transistor body connections may further couple a second voltage source to the nMOS transistor body. The MOS device may include a second set of transistor body connections adjacent the pMOS transistor and the nMOS transistor. The second set of transistor body connections may couple the nMOS transistor gate to the pMOS transistor body. The second set of transistor body connections may further couple the pMOS transistor gate to the nMOS transistor body.

27 Claims, 9 Drawing Sheets

(56) References Cited

U.S. PATENT DOCUMENTS

| | | |
|---|---|---|
| 7,750,511 B2 | 7/2010 | Agarwal et al. |
| 8,188,516 B2 | 5/2012 | Correale, Jr. et al. |
| 8,227,846 B2 | 7/2012 | Carlson |
| 9,438,225 B1 * | 9/2016 | Yeung ................ H01L 27/0248 |
| 2006/0237726 A1 | 10/2006 | Iwamatsu et al. |
| 2007/0045770 A1 | 3/2007 | Aoki |
| 2007/0252217 A1 | 11/2007 | Oki |
| 2009/0034658 A1 | 2/2009 | Lu et al. |
| 2009/0212853 A1 * | 8/2009 | Kim ................... H01L 27/0727 |
| | | 327/539 |
| 2009/0243658 A1 * | 10/2009 | Yokoi ................ H01L 27/0629 |
| | | 326/102 |

* cited by examiner

BULK CROSS-COUPLED HIGH DENSITY POWER SUPPLY DECOUPLING CAPACITOR

BACKGROUND

Field

The present disclosure relates generally to semiconductor design, and more particularly, to decoupling capacitors.

Background

A decoupling capacitor (may also be referred to as "decap") is a capacitor used to decouple one part of an electrical network (circuit) from another. Noise caused by other circuit elements is shunted through the decoupling capacitor, reducing the effect it has on the rest of the circuit. A certain amount of power supply decoupling capacitors may be used for maintaining power integrity. Decoupling capacitors can take up significant area, e.g., up to 50% of an integrated circuit (IC). Higher capacitance density allows area reduction and/or improved power integrity, thus is desirable.

When the gate oxide or dielectric material between gate terminal and semiconductor channel of a metal oxide semiconductor (MOS) transistor forming a decoupling capacitor is thinner than a pre-determined threshold, the gate may be referred to as a thin-oxide gate, the MOS transistor may be referred to as a thin-oxide MOS transistor, and the decoupling capacitor may be referred to as a thin-oxide decoupling capacitor. Thin-oxide decoupling capacitor has high capacitance density, but electrostatic discharge (ESD) rules prohibit thin-oxide gates from being directly tied to the p-type MOS (pMOS) supply voltage (Vdd) or the n-type MOS (nMOS) supply voltage (Vss) because gate oxide may be damaged due to directly connecting gate to power supply. Thus, when incorporating thin-oxide decoupling capacitors in semiconductor components, additional area overhead may result in order to work around this ESD restriction.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Thin-oxide decoupling capacitor has high capacitance density, but ESD rules prohibit thin-oxide gates from being directly tied to Vdd or Vss because gate oxide may be damaged due to directly connecting gate to power supply. The present disclosure relates to using thin-oxide gates to increase on-chip power supply decoupling capacitance without degrading frequency response, adding masks, increasing area, or violating ESD rules.

In an aspect of the disclosure, a MOS device is provided. The MOS device may include a pMOS transistor having a pMOS transistor gate, a pMOS transistor source, a pMOS transistor drain, and a pMOS transistor body. The pMOS transistor source may be coupled to the pMOS transistor drain and to a first voltage source. The MOS device may include an nMOS transistor having an nMOS transistor gate, an nMOS transistor source, an nMOS transistor drain, and an nMOS transistor body. The nMOS transistor source may be coupled to the nMOS transistor drain and to a second voltage source less than the first voltage source. The MOS device may include a first set of transistor body connections adjacent the pMOS transistor and the nMOS transistor. The first set of transistor body connections may couple the first voltage source to the pMOS transistor body. The first set of transistor body connections may further couple the second voltage source to the nMOS transistor body. The MOS device may include a second set of transistor body connections adjacent the pMOS transistor and the nMOS transistor. The second set of transistor body connections may couple the nMOS transistor gate to the pMOS transistor body. The second set of transistor body connections may further couple the pMOS transistor gate to the nMOS transistor body.

In another aspect of the disclosure, a method and an apparatus for operating a MOS device are provided. The apparatus may provide a first voltage to a pMOS transistor source and a pMOS transistor drain of a pMOS transistor. The pMOS transistor may further have a pMOS transistor gate and a pMOS transistor body. The pMOS transistor body may be a part of an n-well. The apparatus may provide a second voltage to an nMOS transistor source and an nMOS transistor drain of an nMOS transistor. The nMOS transistor may further have an nMOS transistor gate and an nMOS transistor body. The nMOS transistor body may be a part of a p-substrate. The second voltage may be less than the first voltage. The apparatus may provide the first voltage to the n-well. The apparatus may provide the second voltage to the p-substrate. The apparatus may provide a third voltage from the n-well to the nMOS transistor gate. The apparatus may provide a fourth voltage from the p-substrate to the pMOS transistor gate.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
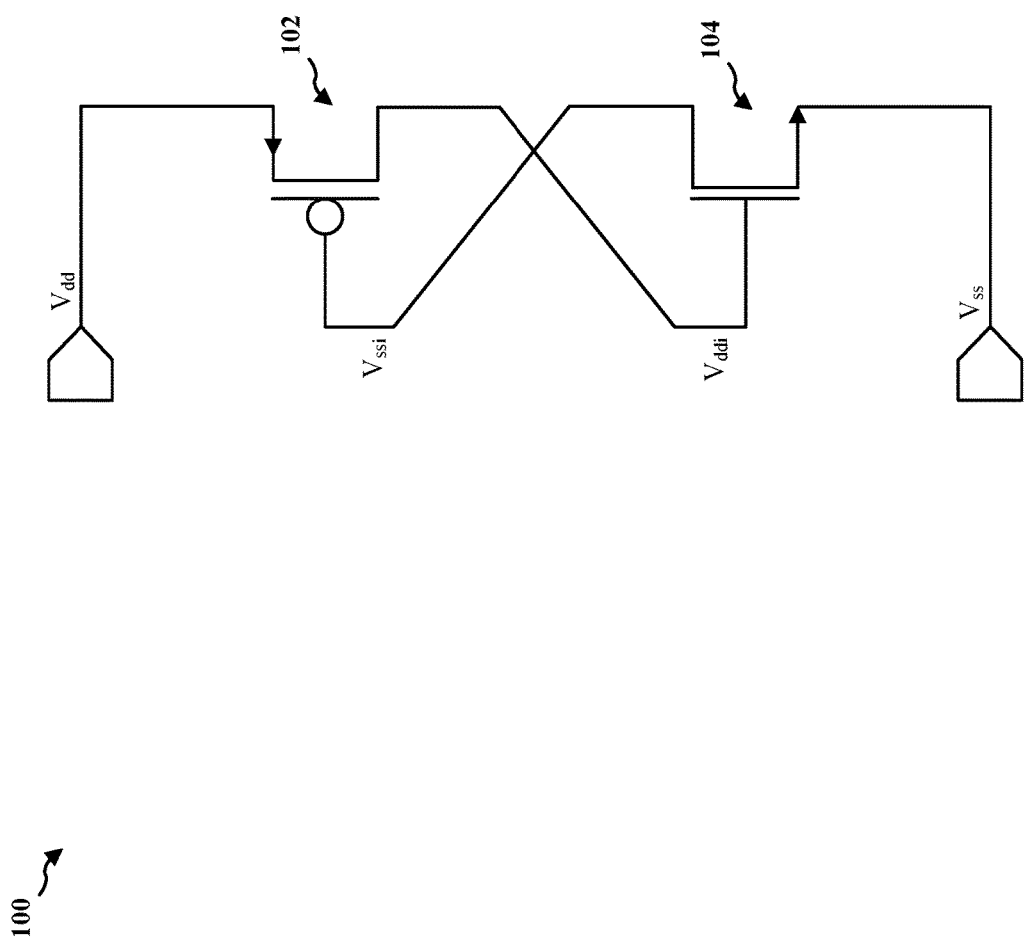
FIG. 1 is a circuit diagram of an example of a cross-coupled thin-oxide decoupling capacitor.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Traditionally, thick-oxide decoupling capacitors may be used to maintain power integrity. However, thick-oxide decoupling capacitors have low capacitance density due to the thick oxide layer. Furthermore, thick-oxide decoupling capacitors have poor scaling. Metal-Insulator-Metal (MIM) capacitors may also be used as decoupling capacitors. However, MIM capacitors may need extra masks, thus introducing extra costs. Furthermore, MIM capacitors may not be as good as thin-oxide FinFETs in terms of capacitance density. Thin-oxide decoupling capacitor with series resistance may be used to maintain power integrity. However, to implement a thin-oxide decoupling capacitor with series resistance, special routing with potential area increase/penalty may be needed. Furthermore, a thin-oxide decoupling capacitor with series resistance may have lower effective capacitance density due to long routing resistance.

Thin-oxide decoupling capacitor has high capacitance density, but ESD rules prohibit thin-oxide gates from being directly tied to Vdd or Vss. The present disclosure relates to using thin-oxide decoupling capacitors without ESD or reliability issues, without area overhead, and with good frequency response.

FIG. 1 is a circuit diagram of an example of a cross-coupled thin-oxide decoupling capacitor 100. In this example, the thin-oxide decoupling capacitor 100 includes a thin-oxide pMOS transistor 102 and a thin-oxide nMOS transistor 104 cross-coupled to each other. Specifically, the drain of the pMOS transistor 102 is connected to the gate of the nMOS transistor 104, and the drain of the nMOS transistor 104 is connected to the gate of the pMOS transistor 102. The source of the pMOS transistor 102 is connected to a first power source (e.g., Vdd). The source of the nMOS transistor 104 is connected to a second power source (e.g., Vss) that is less than the first power source. As a result, the gate of the pMOS transistor 102 is coupled to a transient gate voltage Vssi provided by the drain of the nMOS transistor 104 and the gate of the nMOS transistor 104 is coupled to a transient gate voltage Vddi provided by the drain of the pMOS transistor 102.

Because the thin-oxide gates of the pMOS transistor 102 and the nMOS transistor 104 are not directly connected to Vdd or Vss, the thin-oxide decoupling capacitor 100 is robust to ESD rules. The thin-oxide decoupling capacitor 100 also has high capacitance density due to using thin-oxide transistors. However, because transient gate voltage Vddi or Vssi are not clearly determined, the thin-oxide decoupling capacitor 100 may have unstable or slow frequency response due to gate charging through potentially "off" transistor.

Figure 2:
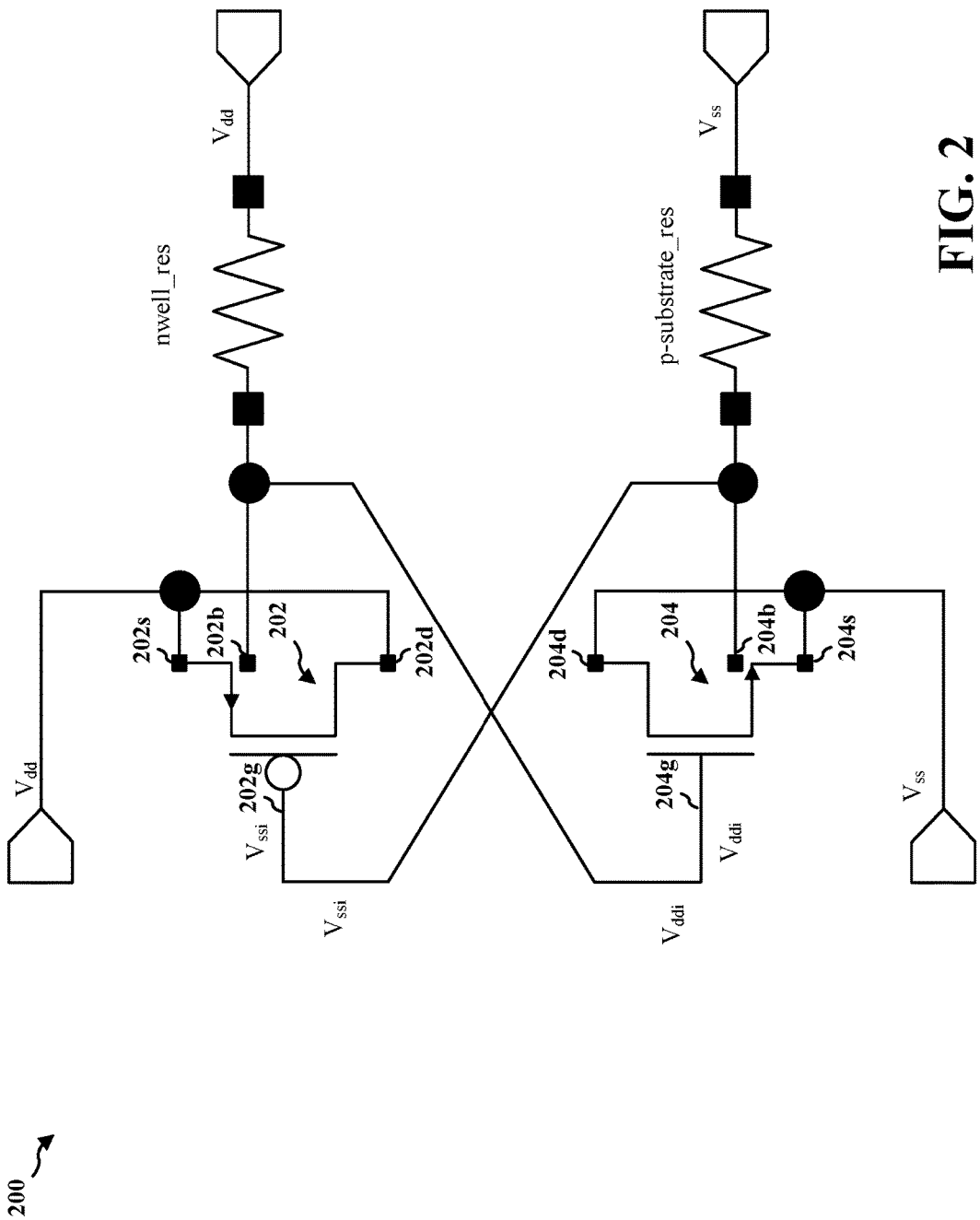
FIG. 2 is a circuit diagram of an example of a bulk cross-coupled thin-oxide decoupling capacitor.

FIG. 2 is a circuit diagram of an example of a bulk cross-coupled thin-oxide decoupling capacitor 200. In this example, the thin-oxide decoupling capacitor 200 includes a thin-oxide pMOS transistor 202 and a thin-oxide nMOS transistor 204, with bulk connections cross-coupled to gates. Specifically, the gate 204g of the nMOS transistor 204 is coupled to a first voltage source (e.g., Vdd) through a resistance of the body 202b of the pMOS transistor 202 (providing a transient voltage Vddi at the gate 202g), and the gate 202g of the pMOS transistor 202 is coupled to a second voltage source (e.g., Vss) through a resistance of the body 204b of the nMOS transistor 204 (providing a transient voltage Vssi at the gate 204g). In one configuration, the resistance of the body 202b of the pMOS transistor 202 may be a resistance through the n-type well (n-well) for the pMOS transistor 202, and the resistance of the body 204b of the nMOS transistor 204 may be a resistance through the p-type substrate (p-substrate) for the nMOS transistor 204. The source 202s and drain 202d of the pMOS transistor 202 are connected to the first power source (e.g., Vdd). The source 204s and drain 204d of the nMOS transistor 204 are connected to the second power source (e.g., Vss) that is less than the first power source.

As shown in FIG. 2, the gate 202g of the pMOS transistor 202 is coupled to a transient gate voltage Vssi provided by the body 204b of the nMOS transistor 204, and the gate 204g of the nMOS transistor 204 is coupled to a transient gate voltage Vddi provided by the body 202b of the pMOS transistor 202. Because the thin-oxide gates of the pMOS transistor 202 and the nMOS transistor 204 are not directly connected to Vdd or Vss, the thin-oxide decoupling capacitor 200 is robust to ESD rules. The thin-oxide decoupling capacitor 200 also has high capacitance density compared to a thick-oxide decoupling capacitor. Because the transient gate voltage Vddi or Vssi are determined by n-well resistance or p-substrate resistance, respectively, the thin-oxide decoupling capacitor 200 may have stable and high frequency response. There is no explicit series resistance added for the decoupling capacitor 200, thus no additional area overhead in implementing the decoupling capacitor 200. In one configuration, the thin-oxide decoupling capacitor 200 may operate faster (e.g., about 10 times faster) than the thin-oxide decoupling capacitor 100 described above with reference to FIG. 1.

In one configuration, the pMOS transistor 202 and the nMOS transistor 204 may be Fin Field Effect Transistors (FinFETs). A FinFET may also be referred to as a multiple gate field-effect transistor (FET) (MuGFET), a tri-gate FET, or a multi-gate FET. When two gates of a MuGFET are tied together, such a device may be referred to as a shorted-gate FinFET or tied-gate FinFET.

Figure 3:
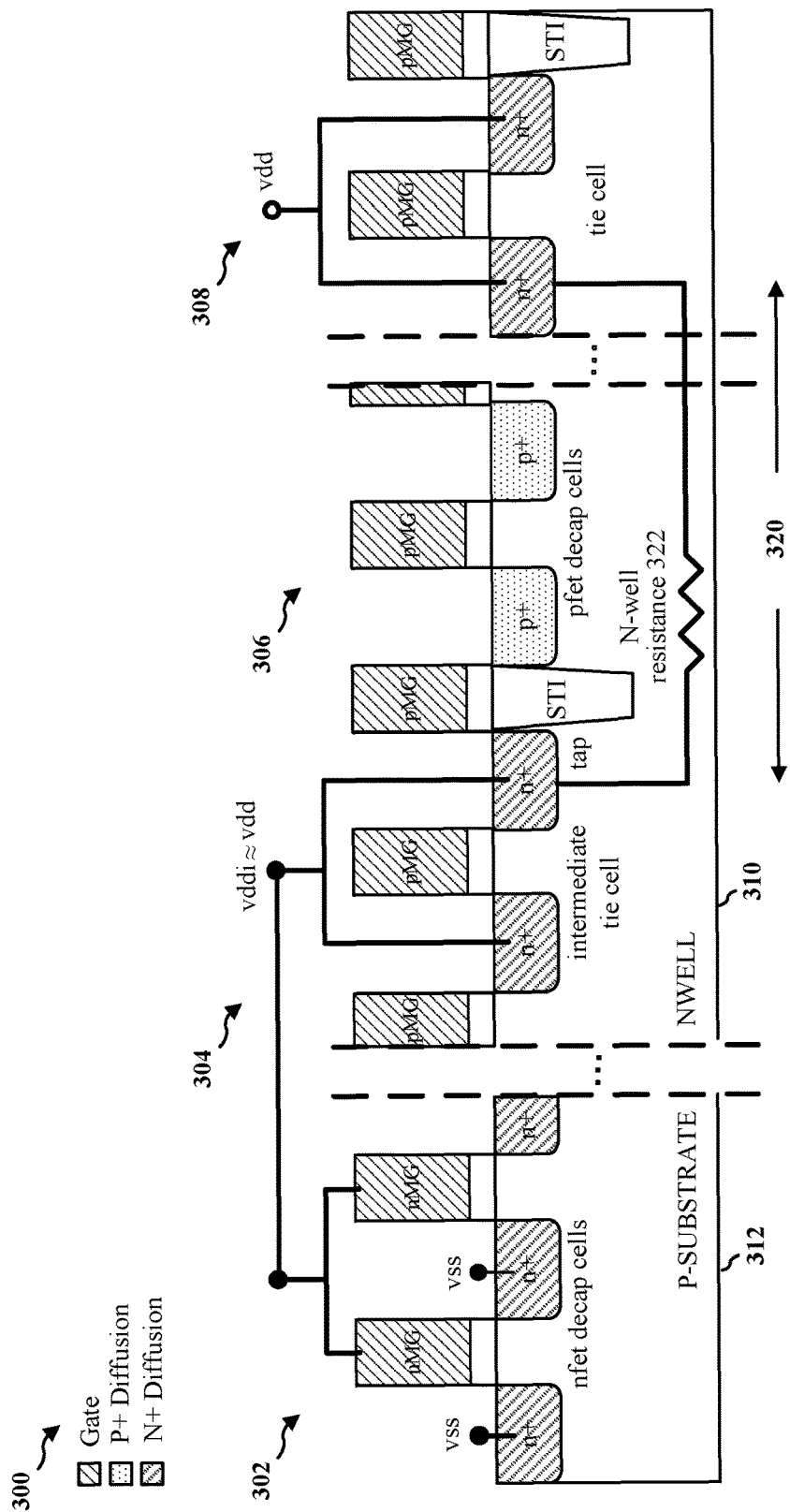
FIG. 3 is a diagram illustrating a cross-sectional view of the bulk of a pMOS transistor cross-coupled to the gate of an nMOS transistor to form a thin-oxide decoupling capacitor.

FIG. 3 is a diagram 300 illustrating a cross-sectional view of the bulks of a set of pMOS transistors 306 cross-coupled to the gates of a set of nMOS transistors 302 to form a thin-oxide decoupling capacitor. In one configuration, the set of nMOS transistors 302 and the set of pMOS transistors 306 may be the thin-oxide nMOS transistor 204 and the thin-oxide pMOS transistor 202, respectively, described above with reference to FIG. 2. The set of nMOS transistors 302 has source/drain n-type diffusion regions (N diffusion regions), gates, and a p-substrate 312 that serves as bodies of the set of nMOS transistors 302. The set of pMOS transistors 306 has source/drain p-type diffusion regions (P diffusion regions), gates, and an n-well 310 that serves as the bodies of the set of pMOS transistors 306. The set of pMOS transistors 306 shares the n-well 310 with an intermediate tie cell 304 and a tie cell 308.

As shown in FIG. 3, the source and drain of the set of nMOS transistors 302 are connected to Vss. The gates of the set of nMOS transistors 302 are connected to the n-well 310 through the N diffusion region of the intermediate tie cell 304. The n-well 310 is also connected to Vdd through the N diffusion region of the tie cell 308. There is a distance 320 between the intermediate tie cell 304 and the tie cell 308. In one configuration, the distance 320 may be greater than a threshold distance (e.g., 1.5 µm). Because of the distance 320, there is an n-well resistance 322 between the intermediate tie cell 304 and the tie cell 308. In one configuration, the n-well resistance 322 may be greater than a threshold resistance (e.g., 1000 Ohms). In one configuration, there may be more than one pMOS transistor between the intermediate tie cell 304 and the tie cell 308. In one configuration, there may be other cells between the set of nMOS transistors 302 and the intermediate tie cell 304.

Because of the n-well resistance 322, the voltage Vddi received at the gates of the set of nMOS transistors 302 may be slightly less than Vdd. Because the thin-oxide gates of the set of nMOS transistors 302 are not directly connected to Vdd, the connections in the diagram 300 are robust to ESD rules.

Figure 4:
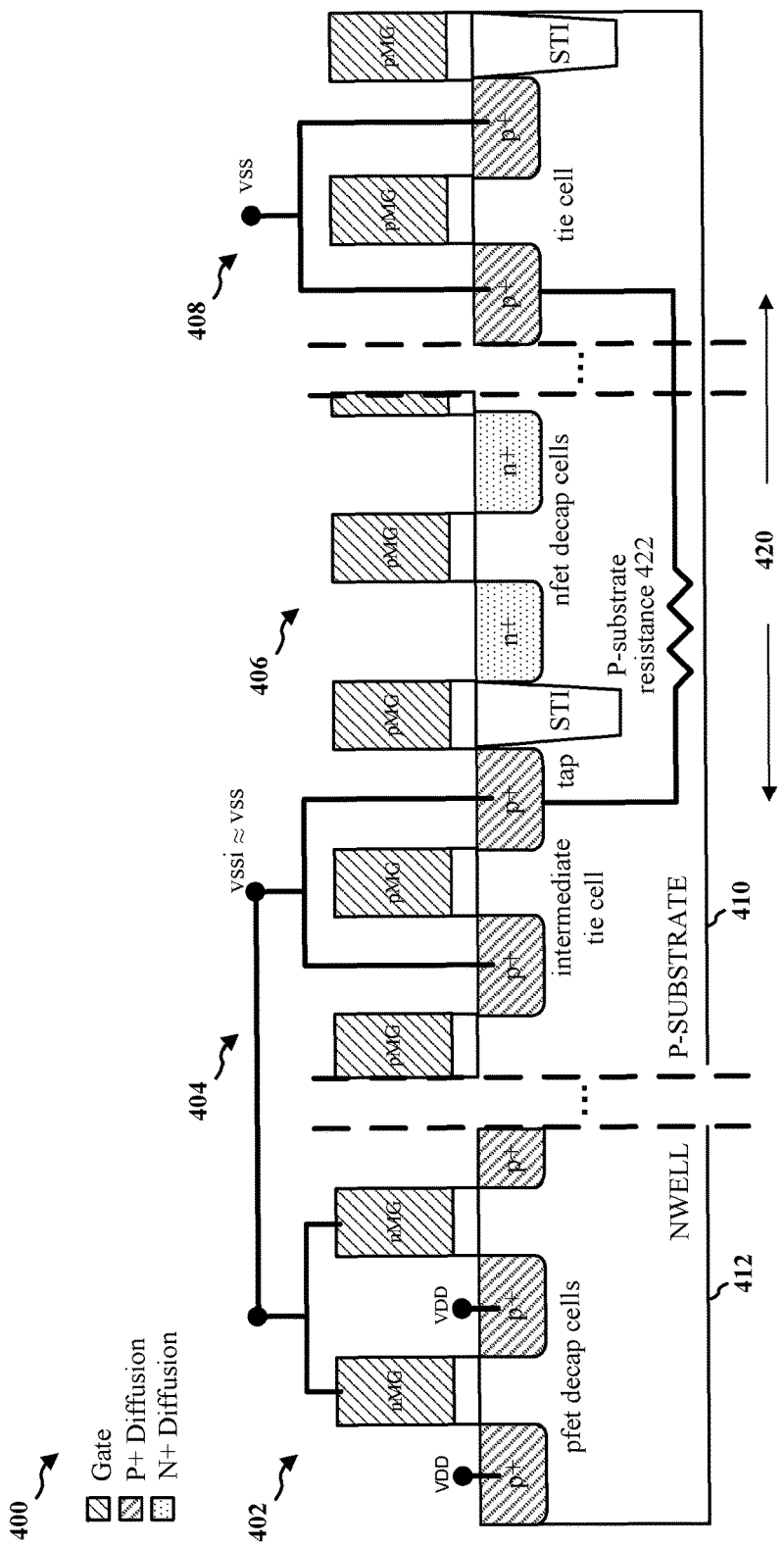
FIG. 4 is a diagram illustrating a cross-sectional view of the bulk of an nMOS transistor cross-coupled to the gate of a pMOS transistor to form a thin-oxide decoupling capacitor.

FIG. 4 is a diagram 400 illustrating a cross-sectional view of the bulk of a set of nMOS transistors 406 cross-coupled to the gates of a set of pMOS transistors 402 to form a thin-oxide decoupling capacitor. In one configuration, the set of pMOS transistors 402 and the set of nMOS transistors 406 may be the thin-oxide pMOS transistor 202 and the thin-oxide nMOS transistor 204, respectively, described above with reference to FIG. 2. The set of pMOS transistors 402 has source/drain P diffusion regions, gates, and an n-well 412 that serves as the bodies of the set of pMOS transistors 402. The set of nMOS transistors 406 has source/drain N diffusion regions, gates, and a p-substrate 410 that serves as the bodies of the set of nMOS transistors 406. The set of nMOS transistors 406 shares the p-substrate 410 with an intermediate tie cell 404 and a tie cell 408.

As shown in FIG. 4, the source and drain of the set of pMOS transistors 402 are connected to Vdd. The gates of the set of pMOS transistors 402 are connected to the p-substrate 410 through the P diffusion region of the intermediate tie cell 404. The p-substrate 410 is also connected to Vss through the P diffusion region of the tie cell 408. There is a distance 420 between the intermediate tie cell 404 and the tie cell 408. In one configuration, the distance 420 may be greater than a threshold distance (e.g., 1.5 µm). Because of the distance 420, there is a p-substrate resistance 422 between the intermediate tie cell 404 and the tie cell 408. In one configuration, the p-substrate resistance 422 may be greater than a threshold resistance (e.g., 1000 Ohms). In one configuration, there may be more than one nMOS transistor between the intermediate tie cell 404 and the tie cell 408. In one configuration, there may be other cells between the set of pMOS transistors 402 and the intermediate tie cell 404.

Because of the p-substrate resistance 422, the voltage Vssi received at the gates of the set of pMOS transistors 402 may be slightly less than Vss. Because the thin-oxide gates of the set of pMOS transistors 402 are not directly connected to Vss, the connections in the diagram 400 are robust to ESD rules.

Figure 5:
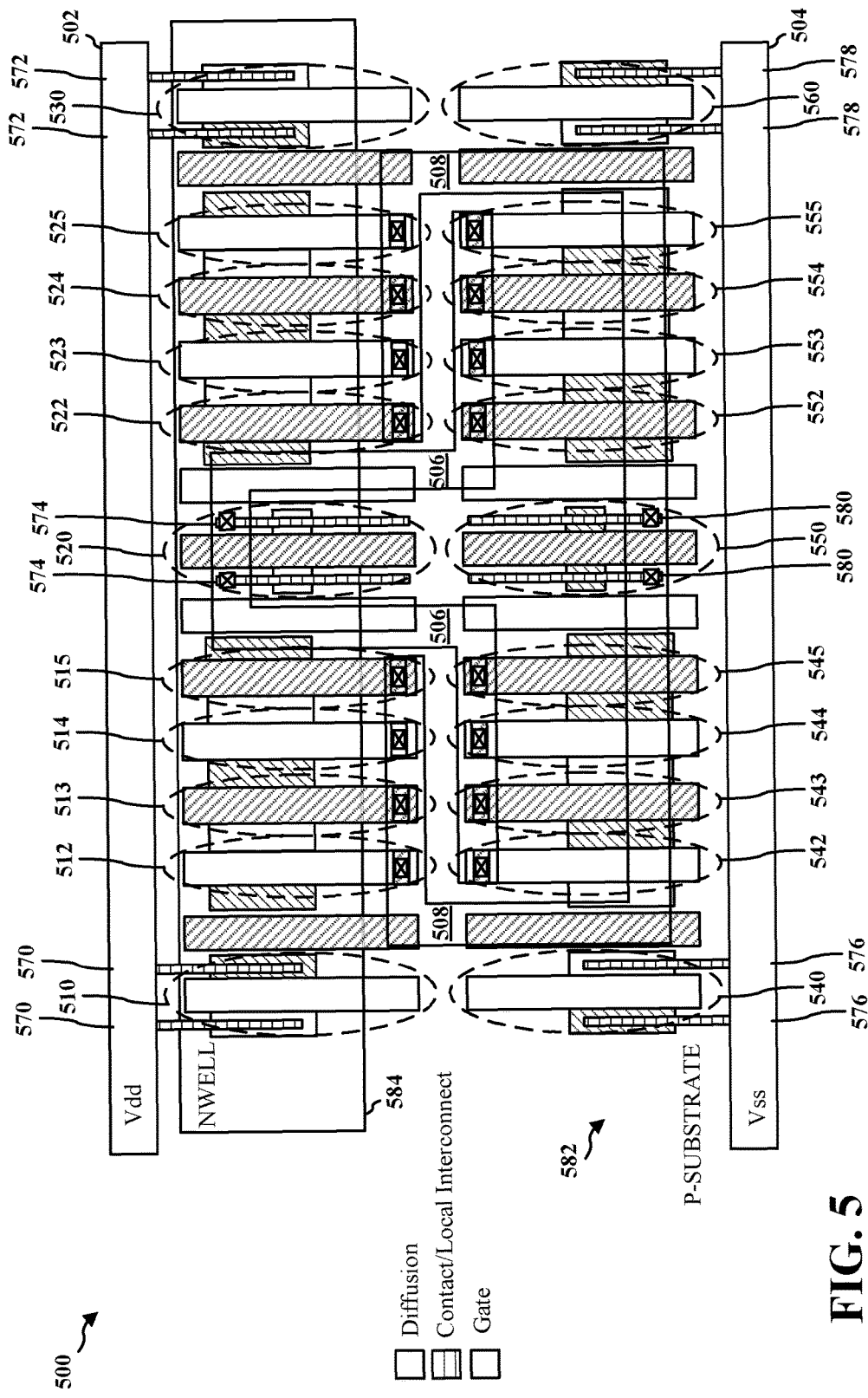
FIG. 5 is a diagram illustrating a conceptual layout of an example of a bulk cross-coupled thin-oxide decoupling capacitor.

FIG. 5 is a diagram illustrating a conceptual layout of an example of a bulk cross-coupled thin-oxide decoupling capacitor. Specifically, this figure illustrates an exemplary layout of the thin-oxide decoupling capacitor described above with reference to FIGS. 2-4. In this example, a MOS device 500 includes thin-oxide pMOS transistors 512-515, 522-525 and thin-oxide nMOS transistors 542-545, 552-555. The MOS device 500 also includes intermediate tie cells 520, 550, and tie cells 510, 530, 540, and 560. The pMOS transistors 512-515, 522-525, the intermediate tie cell 520, and the tie cells 510, 530 may share a common n-well 584. The nMOS transistors 542-545, 552-555, the intermediate tie cell 550, the tie cells 540, 560 may share a common p-substrate 582.

As shown in FIG. 5, the n-well 584 is coupled to Vdd through the tie cells 510 and 530. Specifically, the n-well 584 is coupled to Vdd through a transistor body connection 570 that connects the N diffusion region of the tie cell 510 to a power rail 502 carrying Vdd, and through a transistor body connection 572 that connects the N diffusion region of the tie cell 530 to the power rail 502. The gates of the nMOS transistors 542-545 and 552-555 are coupled to the n-well 584 through the intermediate tie cell 520. Specifically, the gates of the nMOS transistors 542-545 and 552-555 are coupled to the n-well 584 through a transistor body connection 574 that connects the N diffusion region of the intermediate tie cell 520 to an interconnect 506, which connects to the gates of the nMOS transistors 542-545 and 552-555. There is a distance between the intermediate tie cell 520 and the tie cell 510 or 530. As a result, the voltage received at the gates of the nMOS transistors 542-545 and 552-555 is different from Vdd due to n-well resistance between the intermediate tie cell 520 and the tie cell 510 or 530. The nMOS transistors 542-545 and 552-555 may be the nMOS transistor 204 described above with reference to FIG. 2. The gates of the nMOS transistors 542-545 and 552-555 are not directly connected to Vdd. Instead, the gates of the nMOS transistors 542-545 and 552-555 are connected to Vdd through the n-well resistance between the intermediate tie cell 520 and the tie cells 510 and 530 (which are connected to Vdd).

The p-substrate 582 is coupled to Vss through the tie cells 540 and 560. Specifically, the p-substrate 582 is coupled to Vss through a transistor body connection 576 that connects the P diffusion region of the tie cell 540 to a power rail 504 carrying Vss, and through a transistor body connection 578 that connects the P diffusion region of the tie cell 560 to the power rail 504. The gates of the pMOS transistors 512-515 and 522-525 are coupled to the p-substrate 582 through the intermediate tie cell 550. Specifically, the gates of the pMOS transistors 512-515 and 522-525 are coupled to the p-substrate 582 through a transistor body connection 580 that connects the P diffusion region of the intermediate tie cell 550 to an interconnect 508, which connects to the gates of the pMOS transistors 512-515 and 522-525. There is a distance between the intermediate tie cell 550 and the tie cell 540 or 560. As a result, the voltage received at the gates of the pMOS transistors 512-515 and 522-525 is different from Vss due to p-substrate resistance between the intermediate tie cell 550 and the tie cell 540 or 560. The pMOS transistors 512-515 and 522-525 may be the pMOS transistor 202 described above with reference to FIG. 2. The gates of the pMOS transistors 512-515 and 522-525 are not directly connected to Vss. Instead, the gates of the pMOS transistors 512-515 and 522-525 are connected to Vss through the p-substrate resistance between the intermediate tie cell 550 and the tie cells 540 and 560 (which are connected to Vss).

Figure 6:
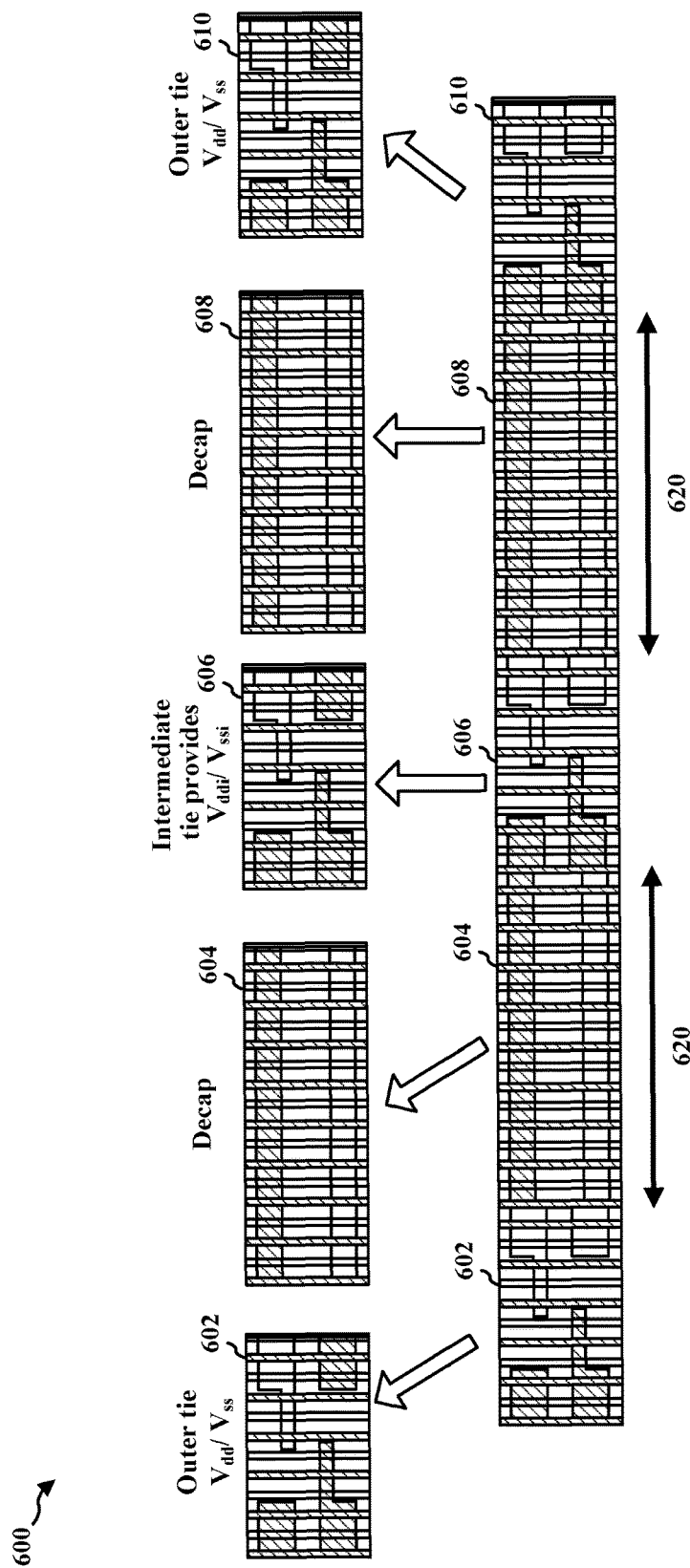
FIG. 6 is a diagram illustrating a layout of an example of a bulk cross-coupled thin-oxide decoupling capacitor.

FIG. 6 is a diagram illustrating a layout of an example of a bulk cross-coupled thin-oxide decoupling capacitor. Specifically, this figure illustrates an exemplary layout of the thin-oxide decoupling capacitor described above with reference to FIGS. 2-5. In this example, a MOS device 600 includes outer tie cells 602 and 610, decap cells 604 and 608, and an intermediate tie cell 606. The outer tie cells 602 and 610, the decap cells 604 and 608, and the intermediate tie cell 606 may share a common n-well and a common p-substrate. In one configuration, the outer tie cell 602 may be the tie cells 510 and 540 described above with reference to FIG. 5, the outer tie cell 610 may be the tie cells 530 and 560 described above with reference to FIG. 5, the intermediate tie cell 606 may be the intermediate tie cells 520 and 550 described above with reference to FIG. 5, the decap cells 604 may include pMOS transistors (e.g., 512-515) and nMOS transistors (e.g., 542-545), and the decap cells 608 may include pMOS transistors (e.g., 522-525) and nMOS transistors (e.g., 552-555).

In one configuration, the outer tie cells 602 and 610 may connect the shared p-substrate to Vss and the shared n-well to Vdd. The intermediate tie cell 606 may provide voltages Vddi and Vssi to the decap cells 604 and 608. For example, the voltage Vddi may be provided to gates of the nMOS transistors in decap cells 604 and 608, and the voltage Vssi may be provided to gates of the pMOS transistors in decap cells 604 and 608. Because there is a distance 620 between the intermediate tie cell 606 and the outer tie cell 602 or 610, the intermediate tie cell 606 is resistively connected via the well to the outer tie cells 602 and 610. Therefore, the voltages Vddi and Vssi provided by the intermediate tie cell 606 may be different from Vdd and Vss, respectively. In one configuration, the tie cells 602, 606, and 610 may be large and shared among multiple decap cells.

Figure 7:
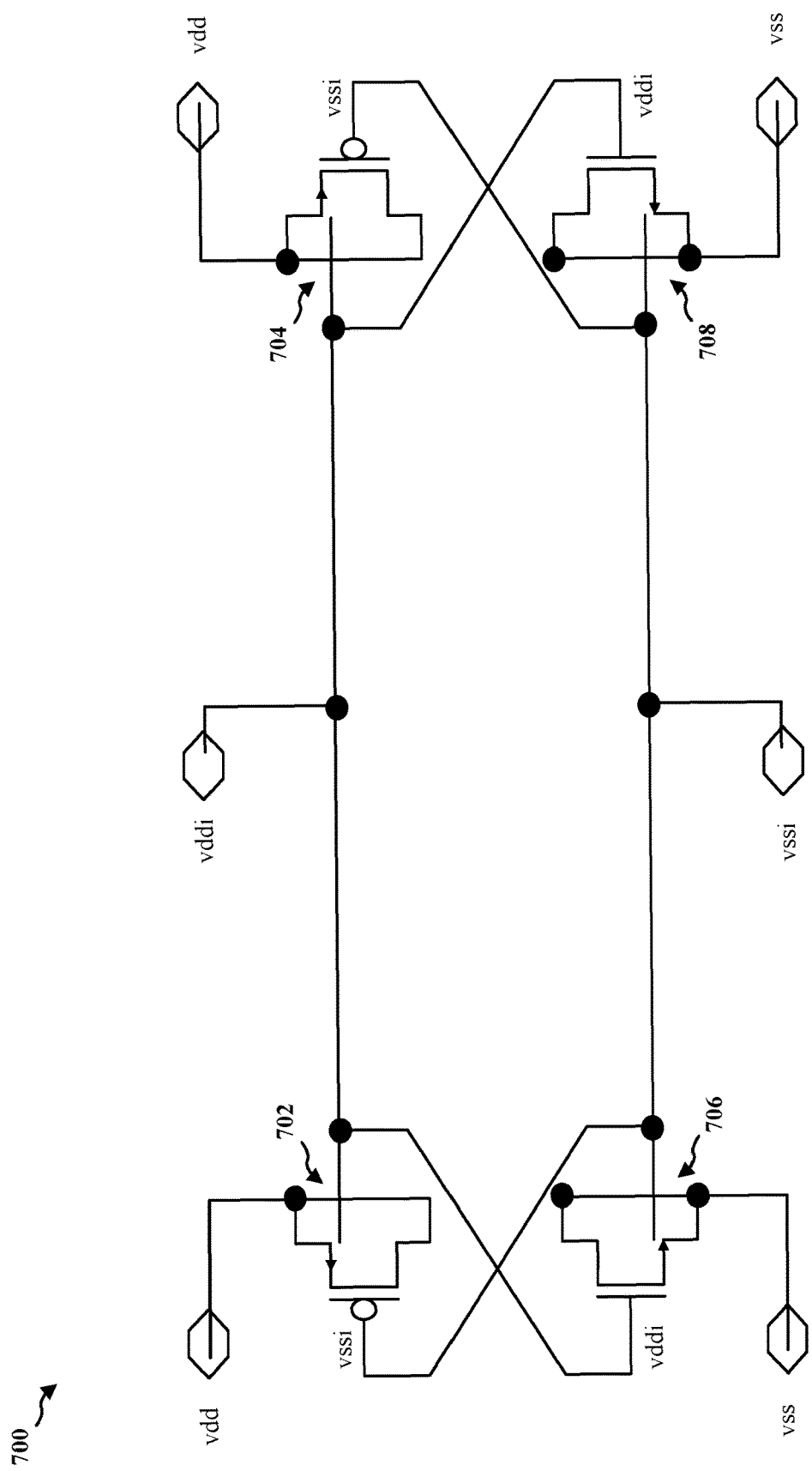
FIG. 7 is a circuit diagram of an example of a bulk cross-coupled thin-oxide decoupling capacitor.

FIG. 7 is a circuit diagram of an example of a bulk cross-coupled thin-oxide decoupling capacitor 700. In one configuration, the thin-oxide decoupling capacitor 700 may be the MOS device 600 described above with reference to FIG. 6. In this example, the thin-oxide decoupling capacitor 700 includes thin-oxide pMOS transistors 702, 704 and thin-oxide nMOS transistors 706, 708. The gates of the nMOS transistors 706 and 708 are coupled to a voltage Vddi, which is provided by the intermediate tie cell 606 described above with reference to FIG. 6. The voltage Vddi is obtained by conducting a voltage Vdd through a resistance of the body of the pMOS transistors (e.g., 702 and 704) within the decap cells 604 and 608. The body of the pMOS transistors (e.g., 702 and 704) may be coupled to the voltage Vdd via the outer tie cells 602 and 610 described above with reference to FIG. 6.

The gates of the pMOS transistors 702 and 704 are coupled to a voltage Vssi, which is provided by the intermediate tie cell 606 described above with reference to FIG. 6. The voltage Vssi is obtained by conducting a voltage Vss through a resistance of the body of the nMOS transistors (e.g., 706 and 708) within the decap cells 604 and 608. The body of the nMOS transistors (e.g., 706 and 708) may be coupled to the voltage Vss via the outer tie cells 602 and 610 described above with reference to FIG. 6. The source and drain of the pMOS transistors 702 and 704 are connected to the voltage Vdd. The source and drain of the nMOS transistors 706 and 708 are connected to the voltage Vss.

In one configuration, the bulk cross-coupled thin-oxide decoupling capacitor described above in FIGS. 2-7 is a MOS device. The MOS device may include a pMOS transistor (e.g., 202, 306, 402, 512, 513, 514, 515, or 702) having a pMOS transistor gate, a pMOS transistor source, a pMOS transistor drain, and a pMOS transistor body (e.g., within the n-well 584). The pMOS transistor source may be coupled to the pMOS transistor drain and to a first voltage source (e.g., Vdd).

The MOS device may include an nMOS transistor (e.g., 204, 302, 406, 542, 543, 544, 545, or 706) having an nMOS transistor gate, an nMOS transistor source, an nMOS transistor drain, and an nMOS transistor body (e.g., within the p-substrate 582). The nMOS transistor source may be coupled to the nMOS transistor drain and to a second voltage source (e.g., Vss) less than the first voltage source.

The MOS device may include a first set of transistor body connections (e.g., 570, 576) adjacent the pMOS transistor (e.g., 515) and the nMOS transistor (e.g., 545). The first set of transistor body connections (570) may couple the first voltage source (Vdd) to the pMOS transistor body (e.g., within the n-well 584). The first set of transistor body connections (576) may further couple the second voltage source (Vss) to the nMOS transistor body (e.g., within the p-substrate 582).

The MOS device may include a second set of transistor body connections (e.g., 574, 580) adjacent the pMOS transistor (e.g., 515) and the nMOS transistor (e.g., 545). The second set of transistor body connections (574) may couple the nMOS transistor gate to the pMOS transistor body. The second set of transistor body connections (580) may further couple the pMOS transistor gate to the nMOS transistor body.

In one configuration, the second set of transistor body connections (574, 580) may be unconnected to the first voltage source (Vdd) and the second voltage source (Vss). In one configuration, the pMOS transistor (e.g., 515) and the nMOS transistor (e.g., 545) are between the first set of transistor body connections (570, 576) and the second set of transistor body connections (574, 580).

In one configuration, the first set of transistor body connections (570, 576) may include a first pMOS body connection (570) coupling the first voltage source (Vdd) to the pMOS transistor body, and a first nMOS body connection (576) coupling the second voltage source (Vss) to the nMOS transistor body. The second set of transistor body connections (574, 580) may include a second pMOS body connection (574) coupling the nMOS transistor gate to the pMOS transistor body, and a second nMOS body connection (580) coupling the pMOS transistor gate to the nMOS transistor body. A resistance between the first pMOS body connection (570) and the second pMOS body connection (574) may be greater than a first resistance. And a resistance between the first nMOS body connection (576) and the second nMOS body connection (580) may be greater than a second resistance. In one configuration, the first resistance may be greater than a resistance threshold. In one configuration, the second resistance may be greater than a resistance threshold. In one configuration, a distance between the first pMOS body connection (570) and the second pMOS body connection (574) may be greater than a distance threshold. In one configuration, a distance between the first nMOS body connection (576) and the second nMOS body connection (580) may be greater than a distance threshold.

In one configuration, the MOS device may further include a second pMOS transistor (e.g., 202, 306, 402, 522, 523, 524, 525, or 704) having a second pMOS transistor gate, a second pMOS transistor source, a second pMOS transistor drain, and a second pMOS transistor body (e.g., within the n-well 584). The second pMOS transistor source may be coupled to the second pMOS transistor drain and to the first voltage source (Vdd).

The MOS device may include a second nMOS transistor (e.g., 204, 302, 406, 552, 553, 554, 555, or 708) having a second nMOS transistor gate, a second nMOS transistor source, a second nMOS transistor drain, and a second nMOS transistor body (e.g., within the p-substrate 582). The second nMOS transistor source may be coupled to the second nMOS transistor drain and to the second voltage source (Vss). The second set of transistor body connections (574, 580) may be between the first pMOS transistor (e.g., 515) and the second pMOS transistor (e.g., 522), and may be between the first nMOS transistor (e.g., 545) and the second nMOS transistor (e.g., 552).

In one configuration, the MOS device may further include a third set of transistor body connections (572, 578) adjacent the second pMOS transistor (e.g., 522) and the second nMOS transistor (e.g., 552). The third set of transistor body connections (572) may couple the first voltage source (Vdd) to the second pMOS transistor body. The third set of transistor body connections (578) may further couple the second voltage source (Vss) to the second nMOS transistor body.

In one configuration, the MOS device may further include a first set of pMOS transistors (e.g., 512, 513, 514) coupled in parallel with the pMOS transistor (515). Each of the first set of pMOS transistors (e.g., 512, 513, 514) may have a source coupled together and to the pMOS transistor source, a drain coupled together and to the pMOS transistor drain, a gate coupled together and to the pMOS transistor gate, and a body coupled together and to the pMOS transistor body. The MOS device may further include a first set of nMOS transistors (e.g., 542, 543, 544) coupled in parallel with the nMOS transistor (545). Each of the first set of nMOS transistors (e.g., 542, 543, 544) may have a source coupled together and to the nMOS transistor source, a drain coupled together and to the nMOS transistor drain, a gate coupled together and to the nMOS transistor gate, and a body coupled together and to the nMOS transistor body. The MOS device may further include a second set of pMOS transistors (e.g., 523, 524, 525) coupled in parallel with the second pMOS transistor (e.g., 522). Each of the second set of pMOS transistors (e.g., 523, 524, 525) may have a source coupled together and to the second pMOS transistor source, a drain coupled together and to the second pMOS transistor drain, a gate coupled together and to the second pMOS transistor gate, and a body coupled together and to the second pMOS transistor body. The MOS device may further include a second set of nMOS transistors (e.g., 553, 554, 555) coupled in parallel with the second nMOS transistor (e.g., 552). Each of the second set of nMOS transistors (e.g., 553, 554, 555) may have a source coupled together and to the second nMOS transistor source, a drain coupled together and to the second nMOS transistor drain, a gate coupled together and to the second nMOS transistor gate, and a body coupled together and to the second nMOS transistor body.

In one configuration, the pMOS transistor (515), the first set of pMOS transistors (512, 513, 514), the nMOS transistor (545), and the first set of nMOS transistors (542, 543, 544) are between the first set of transistor body connections (570, 576) and the second set of transistor body connections (574, 580). The second pMOS transistor (522), the second set of pMOS transistors (523, 524, 525), the second nMOS transistor (552), and the second set of nMOS transistors (553, 554, 555) are between the second set of transistor body connections (574, 580) and the third set of transistor body connections (572, 578).

Figure 8:
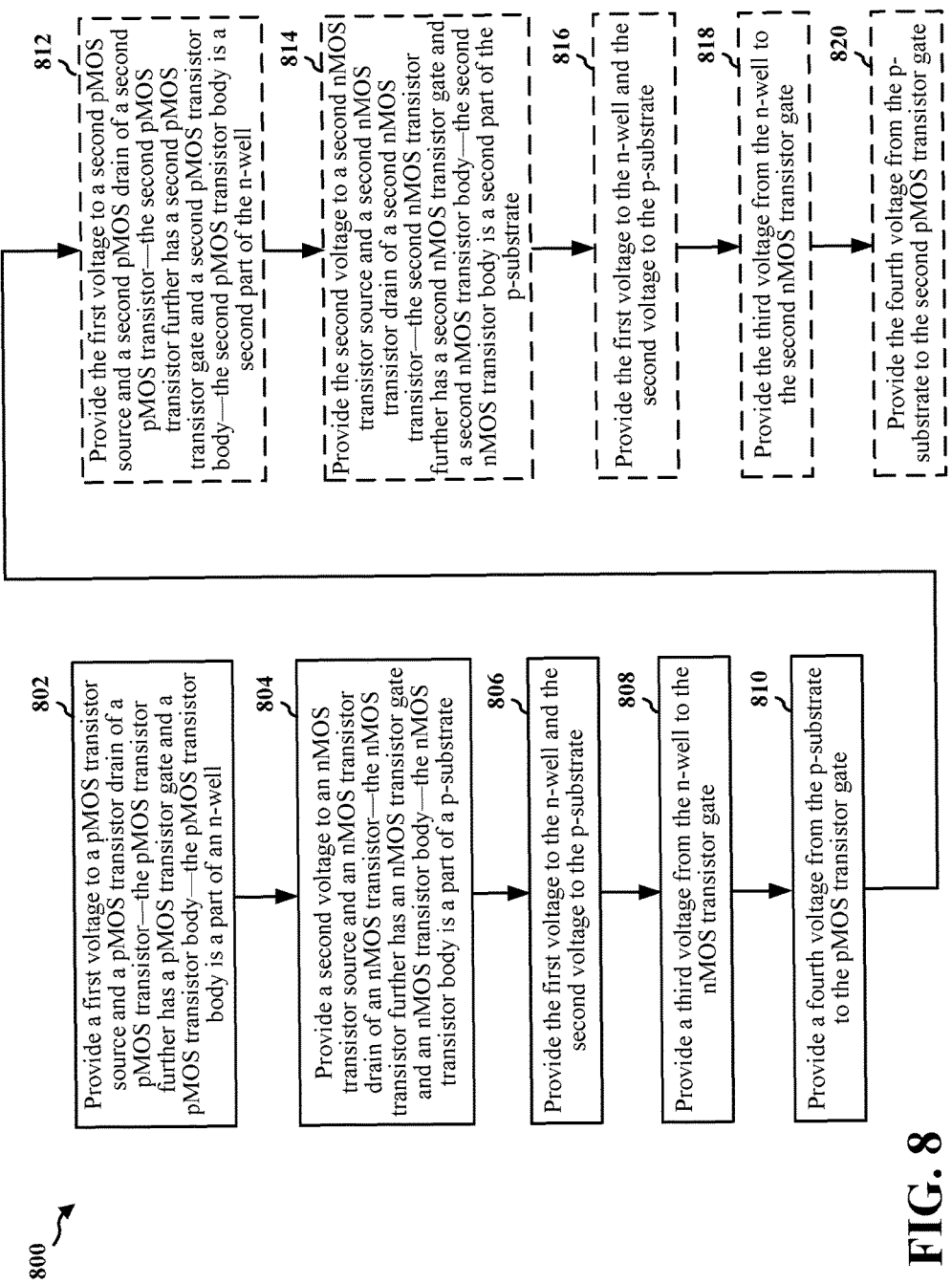
FIG. 8 is a flowchart of a method of operating a MOS device.

FIG. 8 is a flowchart 800 of a method of operating a MOS device. The method may be performed by a MOS device (e.g., the bulk cross-coupled thin-oxide decoupling capacitor described above with reference to FIGS. 2-7). At 802, the device provides a first voltage (e.g., Vdd) to a pMOS transistor source and a pMOS transistor drain of a pMOS transistor (e.g., 515). The pMOS transistor may further have a pMOS transistor gate and a pMOS transistor body. The pMOS transistor body may be a part of an n-well (e.g., the n-well 584).

At 804, the device provides a second voltage (e.g., Vss) to an nMOS transistor source and an nMOS transistor drain of an nMOS transistor (e.g., 545). The nMOS transistor may further have an nMOS transistor gate and an nMOS transistor body. The nMOS transistor body may be a part of a p-substrate (e.g., the p-substrate 582).

At 806, the device may provide the first voltage (Vdd) to the n-well (584) and the second voltage (Vss) to the p-substrate (582).

At 808, the device may provide a third voltage (e.g., Vddi) from the n-well (584) to the nMOS transistor gate. At 810, the device may provide a fourth voltage (e.g., Vssi) from the p-substrate (582) to the pMOS transistor gate. In one configuration, the third voltage (Vddi) may be less than the first voltage (Vdd), and the fourth voltage (Vssi) may be less than the second voltage (Vss).

In one configuration, the first voltage (Vdd) may be provided to the n-well (584) at a first location (e.g., where the tie cell 510 is located) on the n-well and the third voltage (Vddi) is provided from the n-well at a second location (e.g., where the intermediate tie cell 520 is located) on the n-well. In one configuration, the resistance between the first location and the second location may be greater than a resistance threshold. In one configuration, the distance between the first location and the second location may be greater than a distance threshold.

In one configuration, the second voltage (Vss) may be provided to the p-substrate (582) at a first location (e.g., where the tie cell 540 is located) on the p-substrate and the fourth voltage (Vssi) may be provided from the p-substrate at a second location (e.g., where the intermediate tie cell 550 is located) on the p-substrate. In one configuration, the resistance between the first location and the second location may be greater than a resistance threshold. In one configuration, the distance between the first location and the second location may be greater than a distance threshold.

At 812, the device may optionally provide the first voltage (Vdd) to a second pMOS source and a second pMOS drain of a second pMOS transistor (e.g., 522). The second pMOS transistor (522) may further have a second pMOS transistor gate and a second pMOS transistor body. The second pMOS transistor body may be a second part of the n-well (584).

At 814, the device may optionally provide the second voltage (Vss) to a second nMOS transistor source and a second nMOS transistor drain of a second nMOS transistor (e.g., 552). The second nMOS transistor may further have a second nMOS transistor gate and a second nMOS transistor body. The second nMOS transistor body may be a second part of the p-substrate (582).

At 816, the device may optionally provide the first voltage (Vdd) to the n-well (584) and the second voltage (Vss) to the p-substrate (582).

At 818, the device may optionally provide the third voltage (Vddi) from the n-well (584) to the second nMOS transistor gate.

At 820, the device may optionally provide the fourth voltage (Vssi) from the p-substrate (582) to the second pMOS transistor gate.

In one configuration, the device may further include a first set of pMOS transistors (e.g., 512, 513, 514) coupled in parallel with the pMOS transistor (e.g., 515). Each of the first set of pMOS transistors (512, 513, 514) may have a source coupled together and to the pMOS transistor source, a drain coupled together and to the pMOS transistor drain, a gate coupled together and to the pMOS transistor gate, and a body coupled together and to the pMOS transistor body. The device may further include a first set of nMOS transistors (e.g., 542, 543, 544) coupled in parallel with the nMOS transistor (e.g., 545). Each of the first set of nMOS transistors (542, 543, 544) may have a source coupled together and to the nMOS transistor source, a drain coupled together and to the nMOS transistor drain, a gate coupled together and to the nMOS transistor gate, and a body coupled together and to the nMOS transistor body. The device may further include a second set of pMOS transistors (e.g., 523, 524, 525) coupled in parallel with the second pMOS transistor (e.g., 522). Each of the second set of pMOS transistors (523, 524, 525) may have a source coupled together and to the second pMOS transistor source, a drain coupled together and to the second pMOS transistor drain, a gate coupled together and to the second pMOS transistor gate, and a body coupled together and to the second pMOS transistor body. The device may further include a second set of nMOS transistors (e.g., 553, 554, 555) coupled in parallel with the second nMOS transistor (e.g., 552). Each of the second set of nMOS transistors (553, 554, 555) may have a source coupled together and to the second nMOS transistor source, a drain coupled together and to the second nMOS transistor drain, a gate coupled together and to the second nMOS transistor gate, and a body coupled together and to the second nMOS transistor body.

In one configuration, the bulk cross-coupled thin-oxide decoupling capacitor described above with reference to FIGS. 2-8 may be an apparatus for operating a MOS device. In one configuration, the apparatus includes means for providing a first voltage to a pMOS transistor source and a pMOS transistor drain of a pMOS transistor. The pMOS transistor may further have a pMOS transistor gate and a pMOS transistor body. The pMOS transistor body may be a part of an n-well. In one configuration, the means for providing a first voltage to a pMOS transistor source and a pMOS transistor drain of a pMOS transistor may perform operations described above with reference to 802 of FIG. 8. In one configuration, the means for providing a first voltage to a pMOS transistor source and a pMOS transistor drain of a pMOS transistor may be the pMOS transistor (e.g., 202) or the wire connecting the source and drain of the pMOS transistor to Vdd.

In one configuration, the apparatus includes means for providing a second voltage to an nMOS transistor source and an nMOS transistor drain of an nMOS transistor. The nMOS transistor may further have an nMOS transistor gate and an nMOS transistor body. The nMOS transistor body may be a part of a p-substrate. The second voltage may be less than the first voltage. In one configuration, the means for providing a second voltage to an nMOS transistor source and an nMOS transistor drain of an nMOS transistor may perform operations described above with reference to 804 of FIG. 8. In one configuration, the means for providing a second voltage to an nMOS transistor source and an nMOS transistor drain of an nMOS transistor may be the nMOS transistor (e.g., 204) or the wire connecting the source and drain of the nMOS transistor to Vss.

In one configuration, the apparatus may include means for providing the first voltage to the n-well. In one configuration, the means for providing the first voltage to the n-well may perform operations described above with reference to 806 or 816 of FIG. 8. In one configuration, the means for providing the first voltage to the n-well may be the transistor body connection 570 or 572, or the tie cell 510 or 530.

In one configuration, the apparatus may include means for providing the second voltage to the p-substrate. In one configuration, the means for providing the second voltage to the p-substrate may perform operations described above with reference to 806 or 816 of FIG. 8. In one configuration, the means for providing the second voltage to the p-substrate may be the transistor body connection 576 or 578, or the tie cell 540 or 560.

In one configuration, the apparatus may include means for providing a third voltage from the n-well to the nMOS transistor gate. In one configuration, the means for providing a third voltage from the n-well to the nMOS transistor gate may perform operations described above with reference to

808 of FIG. 8. In one configuration, the means for providing a third voltage from the n-well to the nMOS transistor gate may be the transistor body connection 574 or the intermediate tie cell 520.

In one configuration, the apparatus may include means for providing a fourth voltage from the p-substrate to the pMOS transistor gate. In one configuration, the means for providing a fourth voltage from the p-substrate to the pMOS transistor gate may perform operations described above with reference to 810 of FIG. 8. In one configuration, the means for providing a fourth voltage from the p-substrate to the pMOS transistor gate may be the transistor body connection 580 or the intermediate tie cell 550.

In one configuration, the apparatus may include means for providing the first voltage to a second pMOS source and a second pMOS drain of a second pMOS transistor. The second pMOS transistor may further have a second pMOS transistor gate and a second pMOS transistor body. The second pMOS transistor body may be a second part of the n-well. In one configuration, the means for providing the first voltage to a second pMOS source and a second pMOS drain of a second pMOS transistor may perform operations described above with reference to 812 of FIG. 8. In one configuration, the means for providing the first voltage to a second pMOS source and a second pMOS drain of a second pMOS transistor may be the second pMOS transistor (e.g., 522 or 704), or the wire connecting the second pMOS transistor to Vdd.

In one configuration, the apparatus may include means for providing the second voltage to a second nMOS transistor source and a second nMOS transistor drain of a second nMOS transistor. The second nMOS transistor may further have a second nMOS transistor gate and a second nMOS transistor body. The second nMOS transistor body may be a second part of the p-substrate In one configuration, the means for providing the second voltage to a second nMOS transistor source and a second nMOS transistor drain of a second nMOS transistor may perform operations described above with reference to 814 of FIG. 8. In one configuration, the means for providing the second voltage to a second nMOS transistor source and a second nMOS transistor drain of a second nMOS transistor may be the second nMOS transistor (e.g., 552 or 708), or the wire connecting the second nMOS transistor to Vss.

In one configuration, the apparatus may include means for providing the third voltage from the n-well to the second nMOS transistor gate. In one configuration, the means for providing the third voltage from the n-well to the second nMOS transistor gate may perform operations described above with reference to 818 of FIG. 8. In one configuration, the means for providing the third voltage from the n-well to the second nMOS transistor gate may be the transistor body connection 574 or the intermediate tie cell 520.

In one configuration, the apparatus may include means for providing the fourth voltage from the p-substrate to the second pMOS transistor gate. In one configuration, the means for providing the fourth voltage from the p-substrate to the second pMOS transistor gate may perform operations described above with reference to 820 of FIG. 8. In one configuration, the means for providing the fourth voltage from the p-substrate to the second pMOS transistor gate may be the transistor body connection 580 or the intermediate tie cell 550.

As described supra with reference to FIGS. 2-8, an exemplary bulk cross-coupled thin-oxide decoupling capacitor is provided. The bulk cross-coupled thin-oxide decoupling capacitor may have a pair of thin-oxide complementary transistors with bulks cross-coupled to gate. Specifically, the bulk (e.g., n-well) of a pMOS transistor is connected to the gate of an nMOS transistor, and the bulk (e.g., p-substrate) of the nMOS transistor is connected to the gate of the pMOS transistor. Therefore, the resistance of the bulk is in series with the gate, without increasing area overhead. In one configuration, the bulk cross-coupled thin-oxide decoupling capacitor may use existing standard cell library for implementation. The bulk cross-coupled thin-oxide decoupling capacitor has higher capacitance density than thick-oxide decoupling capacitor, without ESD or reliability issues, without area overhead, and with good frequency response.

Figure 9:
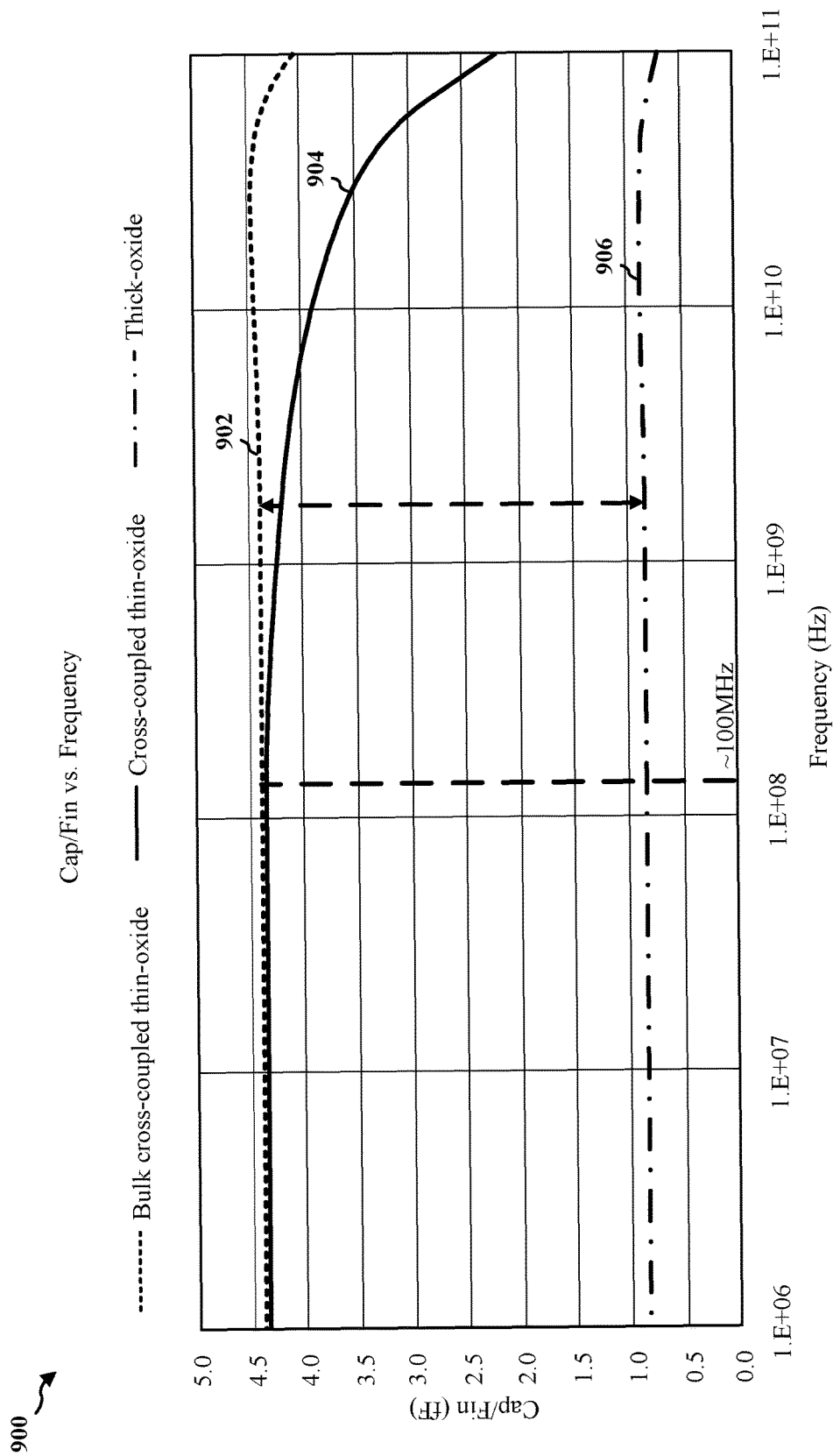
FIG. 9 is a chart illustrating a comparison of capacitance density at different frequency for bulk cross-coupled thin-oxide decoupling capacitors, cross-coupled thin-oxide decoupling capacitors, and thick-oxide decoupling capacitors.

FIG. 9 is a chart 900 illustrating a comparison of capacitance density at different frequency for bulk cross-coupled thin-oxide decoupling capacitors, cross-coupled thin-oxide decoupling capacitors, and thick-oxide decoupling capacitors. The capacitance density versus frequency for bulk cross-coupled thin-oxide decoupling capacitors is shown in curve 902. The capacitance density versus frequency for cross-coupled thin-oxide decoupling capacitors is shown in curve 904. The capacitance density versus frequency for thick-oxide decoupling capacitors is shown in curve 906. In one configuration, the bulk cross-coupled thin-oxide decoupling capacitors may be the decoupling capacitors described above with reference to FIGS. 2-8, and the cross-coupled thin-oxide decoupling capacitors may be the decoupling capacitor 100 described above with reference to FIG. 1.

As shown in the chart 900, at most frequency, the bulk cross-coupled thin-oxide decoupling capacitors may achieve 5 times capacitance density increase compared to the thick-oxide decoupling capacitors. The capacitance density of the cross-coupled thin-oxide decoupling capacitors starts to degrade from around 100 MHz, while the capacitance density of the bulk cross-coupled thin-oxide decoupling capacitors does not degrade until the frequency is close to 100 GHz.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A metal oxide semiconductor (MOS) device, comprising:
    a p-type MOS (pMOS) transistor having a pMOS transistor gate, a pMOS transistor source, a pMOS transistor drain, and a pMOS transistor body, the pMOS transistor source being coupled to the pMOS transistor drain and to a first voltage source;
    an n-type MOS (nMOS) transistor having an nMOS transistor gate, an nMOS transistor source, an nMOS transistor drain, and an nMOS transistor body, the nMOS transistor source being coupled to the nMOS transistor drain and to a second voltage source less than the first voltage source;
    a first set of transistor body connections adjacent the pMOS transistor and the nMOS transistor, the first set of transistor body connections coupling the first voltage source to the pMOS transistor body, the first set of transistor body connections further coupling the second voltage source to the nMOS transistor body; and
    a second set of transistor body connections adjacent the pMOS transistor and the nMOS transistor, the second set of transistor body connections coupling the nMOS transistor gate to the pMOS transistor body, the second set of transistor body connections further coupling the pMOS transistor gate to the nMOS transistor body, wherein the second set of transistor body connections is unconnected to the first voltage source and the second voltage source.

2. The MOS device of claim 1, wherein the pMOS transistor and the nMOS transistor are between the first set of transistor body connections and the second set of transistor body connections.

3. The MOS device of claim 1, wherein:
    the first set of transistor body connections comprises a first pMOS body connection coupling the first voltage source to the pMOS transistor body, and a first nMOS body connection coupling the second voltage source to the nMOS transistor body;
    the second set of transistor body connections comprises a second pMOS body connection coupling the nMOS transistor gate to the pMOS transistor body, and a second nMOS body connection coupling the pMOS transistor gate to the nMOS transistor body;
    a resistance between the first pMOS body connection and the second pMOS body connection being greater than a first resistance; and
    a resistance between the first nMOS body connection and the second nMOS body connection being greater than a second resistance.

4. The MOS device of claim 3, wherein the first resistance is greater than a resistance threshold.

5. The MOS device of claim 3, wherein the second resistance is greater than a resistance threshold.

6. The MOS device of claim 3, wherein a distance between the first pMOS body connection and the second pMOS body connection is greater than a distance threshold.

7. The MOS device of claim 3, wherein a distance between the first nMOS body connection and the second nMOS body connection is greater than a distance threshold.

8. The MOS device of claim 1, further comprising:
    a second pMOS transistor having a second pMOS transistor gate, a second pMOS transistor source, a second pMOS transistor drain, and a second pMOS transistor body, the second pMOS transistor source being coupled to the second pMOS transistor drain and to the first voltage source; and
    a second nMOS transistor having a second nMOS transistor gate, a second nMOS transistor source, a second nMOS transistor drain, and a second nMOS transistor body, the second nMOS transistor source being coupled to the second nMOS transistor drain and to the second voltage source,
    wherein the second set of transistor body connections is between the pMOS transistor and the second pMOS transistor, and is between the nMOS transistor and the second nMOS transistor.

9. The MOS device of claim 8, further comprising a third set of transistor body connections adjacent the second pMOS transistor and the second nMOS transistor, the third set of transistor body connections coupling the first voltage source to the second pMOS transistor body, the third set of transistor body connections further coupling the second voltage source to the second nMOS transistor body.

10. The MOS device of claim 9, further comprising:
    a first set of pMOS transistors coupled in parallel with the pMOS transistor, each of the first set of pMOS transistors having a source coupled together and to the pMOS transistor source, a drain coupled together and to the pMOS transistor drain, a gate coupled together and to the pMOS transistor gate, and a body coupled together and to the pMOS transistor body;
    a first set of nMOS transistors coupled in parallel with the nMOS transistor, each of the first set of nMOS transistors having a source coupled together and to the nMOS transistor source, a drain coupled together and to the nMOS transistor drain, a gate coupled together and to the nMOS transistor gate, and a body coupled together and to the nMOS transistor body;
    a second set of pMOS transistors coupled in parallel with the second pMOS transistor, each of the second set of pMOS transistors having a source coupled together and to the second pMOS transistor source, a drain coupled together and to the second pMOS transistor drain, a gate coupled together and to the second pMOS transistor gate, and a body coupled together and to the second pMOS transistor body; and
    a second set of nMOS transistors coupled in parallel with the second nMOS transistor, each of the second set of nMOS transistors having a source coupled together and to the second nMOS transistor source, a drain coupled together and to the second nMOS transistor drain, a gate coupled together and to the second nMOS transistor gate, and a body coupled together and to the second nMOS transistor body.

11. The MOS device of claim 10, wherein:
the pMOS transistor, the first set of pMOS transistors, the nMOS transistor, and the first set of nMOS transistors are between the first set of transistor body connections and the second set of transistor body connections, and
the second pMOS transistor, the second set of pMOS transistors, the second nMOS transistor, and the second set of nMOS transistors are between the second set of transistor body connections and the third set of transistor body connections.

12. A method of operating a metal oxide semiconductor (MOS) device, comprising:
providing a first voltage to a p-type MOS (pMOS) transistor source and a pMOS transistor drain of a pMOS transistor, the pMOS transistor further having a pMOS transistor gate and a pMOS transistor body, the pMOS transistor body being a part of an n-type well (n-well);
providing a second voltage to an n-type MOS (nMOS) transistor source and an nMOS transistor drain of an nMOS transistor, the nMOS transistor further having an nMOS transistor gate and an nMOS transistor body, the nMOS transistor body being a part of a p-type substrate (p-substrate), the second voltage being less than the first voltage;
providing the first voltage to the n-well;
providing the second voltage to the p-substrate;
providing a third voltage from the n-well to the nMOS transistor gate; and
providing a fourth voltage from the p-substrate to the pMOS transistor gate, wherein the third voltage is less than the first voltage, and the fourth voltage is less than the second voltage.

13. The method of claim 12, wherein the first voltage is provided to the n-well at a first location on the n-well and the third voltage is provided from the n-well at a second location on the n-well.

14. The method of claim 13, wherein a resistance between the first location and the second location is greater than a resistance threshold.

15. The method of claim 13, wherein a distance between the first location and the second location is greater than a distance threshold.

16. The method of claim 12, wherein the second voltage is provided to the p-substrate at a first location on the p-substrate and the fourth voltage is provided from the p-substrate at a second location on the p-substrate.

17. The method of claim 16, wherein a resistance between the first location and the second location is greater than a resistance threshold.

18. The method of claim 16, wherein a distance between the first location and the second location is greater than a distance threshold.

19. The method of claim 12, further comprising:
providing the first voltage to a second pMOS source and a second pMOS drain of a second pMOS transistor, the second pMOS transistor further having a second pMOS transistor gate and a second pMOS transistor body, the second pMOS transistor body being a second part of the n-well; and
providing the second voltage to a second nMOS transistor source and a second nMOS transistor drain of a second nMOS transistor, the second nMOS transistor further having a second nMOS transistor gate and a second nMOS transistor body, the second nMOS transistor body being a second part of the p-substrate.

20. The method of claim 19, further comprising:
providing the third voltage from the n-well to the second nMOS transistor gate; and
providing the fourth voltage from the p-substrate to the second pMOS transistor gate.

21. The method of claim 20, the MOS device further comprising:
a first set of pMOS transistors coupled in parallel with the pMOS transistor, each of the first set of pMOS transistors having a source coupled together and to the pMOS transistor source, a drain coupled together and to the pMOS transistor drain, a gate coupled together and to the pMOS transistor gate, and a body coupled together and to the pMOS transistor body;
a first set of nMOS transistors coupled in parallel with the nMOS transistor, each of the first set of nMOS transistors having a source coupled together and to the nMOS transistor source, a drain coupled together and to the nMOS transistor drain, a gate coupled together and to the nMOS transistor gate, and a body coupled together and to the nMOS transistor body;
a second set of pMOS transistors coupled in parallel with the second pMOS transistor, each of the second set of pMOS transistors having a source coupled together and to the second pMOS transistor source, a drain coupled together and to the second pMOS transistor drain, a gate coupled together and to the second pMOS transistor gate, and a body coupled together and to the second pMOS transistor body; and
a second set of nMOS transistors coupled in parallel with the second nMOS transistor, each of the second set of nMOS transistors having a source coupled together and to the second nMOS transistor source, a drain coupled together and to the second nMOS transistor drain, a gate coupled together and to the second nMOS transistor gate, and a body coupled together and to the second nMOS transistor body.

22. An apparatus for operating a metal oxide semiconductor (MOS) device, comprising:
means for providing a first voltage to a p-type MOS (pMOS) transistor source and a pMOS transistor drain of a pMOS transistor, the pMOS transistor further having a pMOS transistor gate and a pMOS transistor body, the pMOS transistor body being a part of an n-type well (n-well);
means for providing a second voltage to an n-type MOS (nMOS) transistor source and an nMOS transistor drain of an nMOS transistor, the nMOS transistor further having an nMOS transistor gate and an nMOS transistor body, the nMOS transistor body being a part of a p-type substrate (p-substrate), the second voltage being less than the first voltage;
means for providing the first voltage to the n-well;
means for providing the second voltage to the p-substrate;
means for providing a third voltage from the n-well to the nMOS transistor gate, wherein the first voltage is provided to the n-well at a first location on the n-well and the third voltage is provided from the n-well at a second location on the n-well; and
means for providing a fourth voltage from the p-substrate to the pMOS transistor gate.

23. The apparatus of claim 22, wherein a resistance between the first location and the second location is greater than a resistance threshold, wherein a distance between the first location and the second location is greater than a distance threshold.

24. The apparatus of claim 22, wherein the second voltage is provided to the p-substrate at a first location on the p-substrate and the fourth voltage is provided from the p-substrate at a second location on the p-substrate.

25. The apparatus of claim 24, wherein a resistance between the first location and the second location is greater than a resistance threshold, wherein a distance between the first location and the second location is greater than a distance threshold.

26. The apparatus of claim 22, further comprising:
   means for providing the first voltage to a second pMOS source and a second pMOS drain of a second pMOS transistor, the second pMOS transistor further having a second pMOS transistor gate and a second pMOS transistor body, the second pMOS transistor body being a second part of the n-well; and
   means for providing the second voltage to a second nMOS transistor source and a second nMOS transistor drain of a second nMOS transistor, the second nMOS transistor further having a second nMOS transistor gate and a second nMOS transistor body, the second nMOS transistor body being a second part of the p-substrate.

27. The apparatus of claim 26, further comprising:
   means for providing the third voltage from the n-well to the second nMOS transistor gate; and
   means for providing the fourth voltage from the p-substrate to the second pMOS transistor gate.

* * * * *